US010150159B2

United States Patent
Bullied et al.

(10) Patent No.: US 10,150,159 B2
(45) Date of Patent: Dec. 11, 2018

(54) CASTING APPARATUS AND METHOD FOR FORMING MULTI-TEXTURED, SINGLE CRYSTAL MICROSTRUCTURE

(71) Applicant: United Technologies Corporation, Farmington, CT (US)

(72) Inventors: Steven J. Bullied, Pomfret Center, CT (US); David Ulrich Furrer, Marlborough, CT (US); John Joseph Marcin, Marlborough, CT (US); Venkatarama K. Seetharaman, Rocky Hill, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 90 days.

(21) Appl. No.: 15/113,082

(22) PCT Filed: Jan. 9, 2015

(86) PCT No.: PCT/US2015/010727
§ 371 (c)(1),
(2) Date: Jul. 21, 2016

(87) PCT Pub. No.: WO2015/116361
PCT Pub. Date: Aug. 6, 2015

(65) Prior Publication Data
US 2017/0021413 A1    Jan. 26, 2017

Related U.S. Application Data

(60) Provisional application No. 61/932,502, filed on Jan. 28, 2014.

(51) Int. Cl.
*C30B 11/14* (2006.01)
*B22D 27/04* (2006.01)
(Continued)

(52) U.S. Cl.
CPC .............. *B22D 27/045* (2013.01); *B22C 9/04* (2013.01); *B22D 27/08* (2013.01); *C30B 11/002* (2013.01);
(Continued)

(58) Field of Classification Search
CPC ......... C30B 21/00; C30B 21/02; C30B 11/14; B22D 25/00
See application file for complete search history.

(56) References Cited

U.S. PATENT DOCUMENTS

| 4,469,161 A | 9/1984 | Higginbotham et al. |
| 5,787,966 A * | 8/1998 | Lestani ................ B22D 11/142 164/442 |

(Continued)

FOREIGN PATENT DOCUMENTS

| EP | 0293961 | 12/1988 |
| EP | 1375034 | 2/2004 |

(Continued)

OTHER PUBLICATIONS

International Preliminary Report on Patentability for PCT Application No. PCT/US2015/010727 dated Aug. 11, 2016.

(Continued)

*Primary Examiner* — Robert M Kunemund
(74) *Attorney, Agent, or Firm* — Carlson, Gaskey & Olds, P.C.

(57) ABSTRACT

An investment casting apparatus includes a furnace having an opening, a mold support, and a multi-axis actuator connected with the mold support and configured to retract the mold support from the opening with multiple-axis motion. An investment casting method includes withdrawing, with multiple-axis motion, a mold through the opening of the furnace to solidify a molten metal- or metalloid-based material in the mold. The apparatus and method can be used (Continued)

to form a cast article that has a body formed of the metal- or metalloid-based material. The body has a multi-textured, single crystal microstructure.

14 Claims, 2 Drawing Sheets

(51) Int. Cl.
B22C 9/04 (2006.01)
B22D 27/08 (2006.01)
C30B 11/00 (2006.01)
C30B 11/02 (2006.01)
C30B 29/06 (2006.01)

(52) U.S. Cl.
CPC ............ C30B 11/007 (2013.01); C30B 11/02 (2013.01); C30B 29/06 (2013.01)

(56) References Cited

U.S. PATENT DOCUMENTS

| | | | |
|---|---|---|---|
| 6,113,500 A | 9/2000 | Francis et al. | |
| 6,257,311 B1 | 7/2001 | Brinegar | |
| 6,446,701 B1 | 9/2002 | Das | |
| 6,715,539 B2* | 4/2004 | Bianco | F25D 17/067 165/122 |
| 6,896,030 B2* | 5/2005 | Soderstrom | B22D 27/045 164/122.1 |
| 6,966,354 B2 | 11/2005 | Marcin, Jr. et al. | |
| 2005/0211408 A1 | 9/2005 | Bullied et al. | |
| 2008/0099177 A1 | 5/2008 | Graham et al. | |
| 2012/0152483 A1 | 6/2012 | Feng et al. | |
| 2014/0099209 A1* | 4/2014 | Ahmad | B22D 27/045 416/241 R |

FOREIGN PATENT DOCUMENTS

| | | |
|---|---|---|
| EP | 1321208 | 6/2004 |
| JP | 06330703 | 11/1994 |
| JP | 09105706 | 4/1997 |

OTHER PUBLICATIONS

European Search Report for European Patent Application No. 15743056 completed Jul. 27, 2017.
International Search Report and Written Opinion for PCT Application No. PCT/US2015/010727, dated Apr. 24, 2015.

* cited by examiner

CASTING APPARATUS AND METHOD FOR FORMING MULTI-TEXTURED, SINGLE CRYSTAL MICROSTRUCTURE

CROSS-REFERENCE TO RELATED APPLICATION

This application claims priority to U.S. Provisional Application No. 61/932,502, filed Jan. 28, 2014.

BACKGROUND

Casting, such as investment casting, involves feeding a molten material through one or more sprues to fill one or more mold cavities. For single crystal castings, the mold is then slowly withdrawn from a furnace to solidify the material from the bottom of the mold. A grain starter block is arranged at the bottom of the mold to solidify the molten material with a preferred grain orientation. The grain starter block can include a grain selector for preferentially growing a single crystal microstructure. As the molten material cools, a solidification front moves from the bottom of the mold toward the top of the mold. In investment casting, the mold is then removed, leaving a cast work piece. The sprues and excess gating are then cut off from the component.

SUMMARY

An investment casting apparatus according to an example of the present disclosure includes a furnace having an opening, a mold support, and a multi-axis actuator configured to retract the mold support from the opening with multiple-axis motion.

In a further embodiment of any of the foregoing embodiments, the multi-axis actuator has six degrees of freedom with the multiple-axis motion.

In a further embodiment of any of the foregoing embodiments, the multi-axis actuator has degrees of freedom for linear motion.

In a further embodiment of any of the foregoing embodiments, the multi-axis actuator has degrees of freedom for rotary motion.

In a further embodiment of any of the foregoing embodiments, the multi-axis actuator is configured to retract the mold support from the opening with coordinated synchronous multi-axis motion with respect to orientation of the mold support.

In a further embodiment of any of the foregoing embodiments, the multiple-axis motion is non-oscillatory.

A further embodiment of any of the foregoing embodiments includes a grain selector and an investment mold mounted on the mold support and retractable from the furnace through the opening.

In a further embodiment of any of the foregoing embodiments, the multi-axis actuator includes a plurality of prismatic actuators.

A further embodiment of any of the foregoing embodiments includes a mold mounted on the mold support for casting a molten metal- or metalloid-based material, and a controller operably connected with the multi-axis actuator, the controller being configured to selectively vary orientation of a solid-liquid interface formed in the molten metal- or metalloid-based material during retraction with respect to a geometry of the mold.

An investment casting method according to an example of the present disclosure includes withdrawing, with multiple-axis motion, a mold through an opening of a furnace to solidify a molten metal- or metalloid-based material in the mold.

A further embodiment of any of the foregoing embodiments includes withdrawing with multiple-axis motion that includes at least one rotary motion.

A further embodiment of any of the foregoing embodiments includes withdrawing with multiple-axis motion that includes at least two different linear motions.

A further embodiment of any of the foregoing embodiments includes withdrawing with multiple-axis motion that includes at least one linear motion and at least one rotary motion.

A further embodiment of any of the foregoing embodiments includes withdrawing with multiple-axis motion that is non-oscillatory.

A further embodiment of any of the foregoing embodiments includes controlling orientation of a liquid-solid interface of the metal- or metalloid-based material by varying orientation of the mold during the withdrawing, to control texture of the crystal microstructure of the solidified metal- or metalloid-based material.

A cast article according to an example of the present disclosure includes a body formed of a metal- or metalloid-based material. The body has a multi-textured, single crystal microstructure.

In a further embodiment of any of the foregoing embodiments, the body includes a first section having a first texture of the single crystal microstructure with respect to orientation of the single crystal microstructure and a second section having a second, different texture of the single crystal microstructure with respect to orientation of the single crystal microstructure.

In a further embodiment of any of the foregoing embodiments, the body includes a first section having a first crystallographic direction of the single crystal microstructure that is aligned within a cone of +/−10° of an axis and a second section having a second, different crystallographic direction of the single crystal microstructure that is aligned within a cone of +/−10° of the same axis.

In a further embodiment of any of the foregoing embodiments, the first crystallographic direction is <001> and the second crystallographic direction is <111>.

In a further embodiment of any of the foregoing embodiments, the body includes a first section having a first texture of the single crystal microstructure with respect to orientation of the single crystal microstructure, a second section having a second, different texture of the single crystal microstructure with respect to orientation of the single crystal microstructure, and a crystallographic transition section connecting the first section and the second section, the crystallographic transition section having an intermediate texture of the single crystal microstructure with respect to the first texture and the second texture.

BRIEF DESCRIPTION OF THE DRAWINGS

The various features and advantages of the present disclosure will become apparent to those skilled in the art from the following detailed description. The drawings that accompany the detailed description can be briefly described as follows.

DETAILED DESCRIPTION

Figure 1:
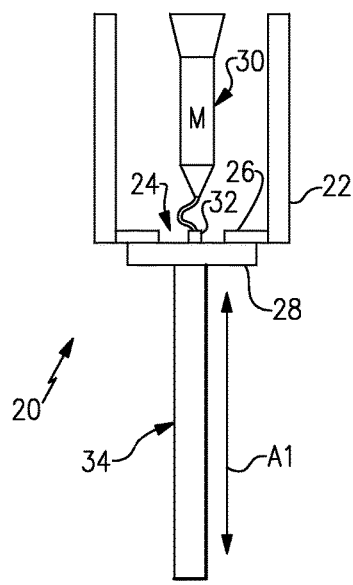
FIG. 1 illustrates a RELATED ART investment casting apparatus.

FIG. 1 illustrates selected portions of a RELATED ART investment casting apparatus 20 that is configured to cast metallic- or metalloid-based articles with a single crystal microstructure. A single crystal microstructure is a microstructure in which the crystal lattice of the entire body or substantially entire body is continuous and unbroken, with no grain boundaries.

The casting apparatus 20 includes a furnace 22 that has an opening 24, which is formed in a baffle 26 at the bottom of the furnace 22. A mold support 28 supports a mold 30 and grain selector 32 for preferentially forming the single crystal microstructure. For example, the grain selector 32 can have a helical shape. The support 28 can be a chilled plate to facilitate the controlled cooling of the molten material in the mold 30 upon withdrawal of the mold 30 from the furnace 22 through the opening 24. In this regard, the casting apparatus 20 includes a linear actuator 34, or elevator, for moving the support 28 and mold 30. The linear actuator 34 is moveable along a single axis of motion, as represented at A1.

Figure 2:
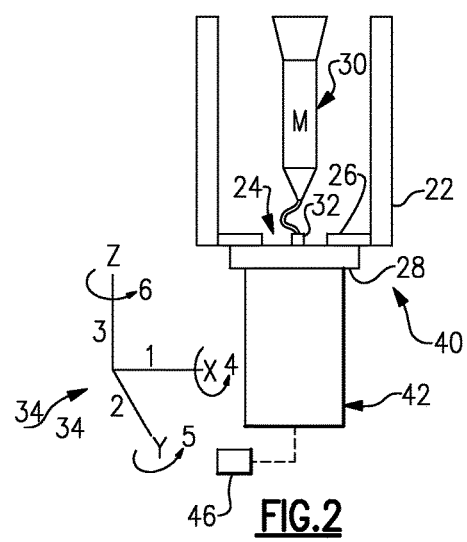
FIG. 2 illustrates a casting apparatus having a multi-axis actuator configured to retract a mold with multiple-axis motion.

FIG. 2 illustrates selected portions of a somewhat similar investment casting apparatus 40, but instead of the linear actuator 34, the casting apparatus 40 includes a multi-axis actuator 42. The multi-axis actuator 42 is connected with the mold support 28 and is configured to retract or withdraw the mold support 28 from the opening 24 with multiple-axis motion.

For example, the multi-axis actuator 42 has six degrees of freedom with the multiple-axis motion, as represented in the coordinate system at 44. In this example, the coordinate system 44 has orthogonal X, Y, and Z axes. The multi-axis actuator 42 can move the mold support 28, and thus also the mold 30, in three degrees of freedom that correspond to linear movement along each of the X, Y, and Z axes. The multi-axis actuator 42 can also move the mold support 28, and thus also the mold 30, in three additional degrees of freedom that correspond rotary motions about the respective X, Y, and Z axes. The six degrees of freedom are labeled in the system 44, with degrees 1-3 corresponding to linear motion along the respective X, Y, and Z axes and degrees 4-6 corresponding to rotary motion about the respective X, Y, and Z axes.

A controller 46 is operably connected with the multi-axis actuator 42 and is configured to control the operation of the multi-axis actuator 42 with respect to the six degrees of freedom of the multiple-axis motion of the mold support 28 and mold 30. The controller 46 can include hardware, software, or both that is configured to retract the mold support 28 from the opening 24 with multiple-axis motion with respect the six degrees of motion freedom. The motion of withdrawing the mold 30 through the opening 24 of the furnace 22 is non-oscillatory in that the motion is constant or non-vibratory. In other words, although the examples herein do not preclude the additional use of high frequency vibration, the motion of retracting the mold 30 from the furnace 22 using the multi-axis actuator 42 is not vibratory. As can be further appreciated, although the multi-axis actuator 42 in the examples herein are connected to the mold support 28 and mold 30, the multi-axis actuator 42 could alternatively be connected to the furnace 22, where practical, to move the furnace 22 with multi-axis motion relative to the mold support 28 and mold 30.

Figure 3:
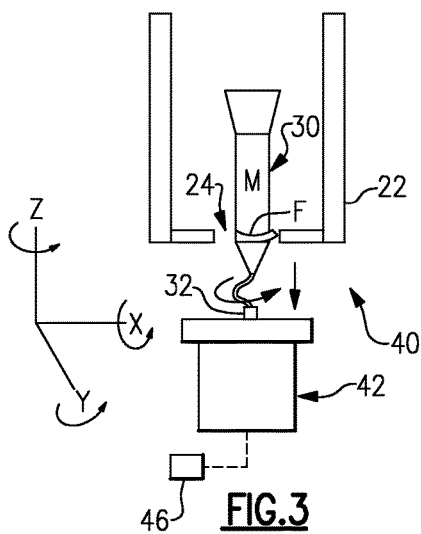
FIG. 3 illustrates multiple-axis motion including linear motion and rotary motion.

Referring also to FIG. 3, the orientation of the mold support 28, and thus also the mold 30, during retraction influences the orientation of a solidification front F in the metallic- or metalloid-based material (represented at M) with respect to the mold 30. For example, the solidification front is a liquid-solid interface formed as the mold is retracted. In the RELATED ART apparatus 20, this solidification front would move linearly from the bottom of the mold 30 to the top because of the linear retraction motion. The resulting single crystal microstructure would be "monotextured" and would therefore have a single crystallographic orientation. For example, depending on the grain selector 32, the <111> direction can be aligned with the Z-axis throughout the body of the cast article. However, with the multiple-axis motion provided by the controller 46 and multi-axis actuator 42, the orientation of the solidification front with respect to the mold 30 (i.e., the "relative orientation" of the solidification front) can be selectively varied during retraction to change the crystallographic orientation at different locations in the body of the cast article. For example, the relative orientation of the liquid-solid interface is controlled by varying orientation of the mold 30 during the withdrawing, to control texture of the crystal microstructure of the solidified metal- or metalloid-based material. The relative orientation of the solidification front can be selectively varied during retraction with respect to the geometry of the mold 30, to produce more favorable crystal microstructures, including secondary orientations, in desired locations of the mold and cast part, for example. The orientation of the single crystal microstructure can be turned and/or twisted such that the resulting single crystal microstructure is "multi-textured." Whereas the term "texture" can refer to a distribution of crystallographic orientations in grains in a polycrystalline sample, the term "texture" as used herein refers to distribution of crystallographic orientations in a single crystal microstructure.

In the example in FIG. 3, the controller 46 and multi-axis actuator 42 are configured to retract the mold support 28 from the opening 24 with multiple-axis motion that includes at least one rotary motion, as described above. The rotary motion can be rotary motion in the degrees of freedom 4-6 discussed above. The rotary motion can be rotary motion with respect to any one of the degrees of freedom 4-6, or with respect to any combination of the degrees of freedom 4-6.

Figures 4, 6:
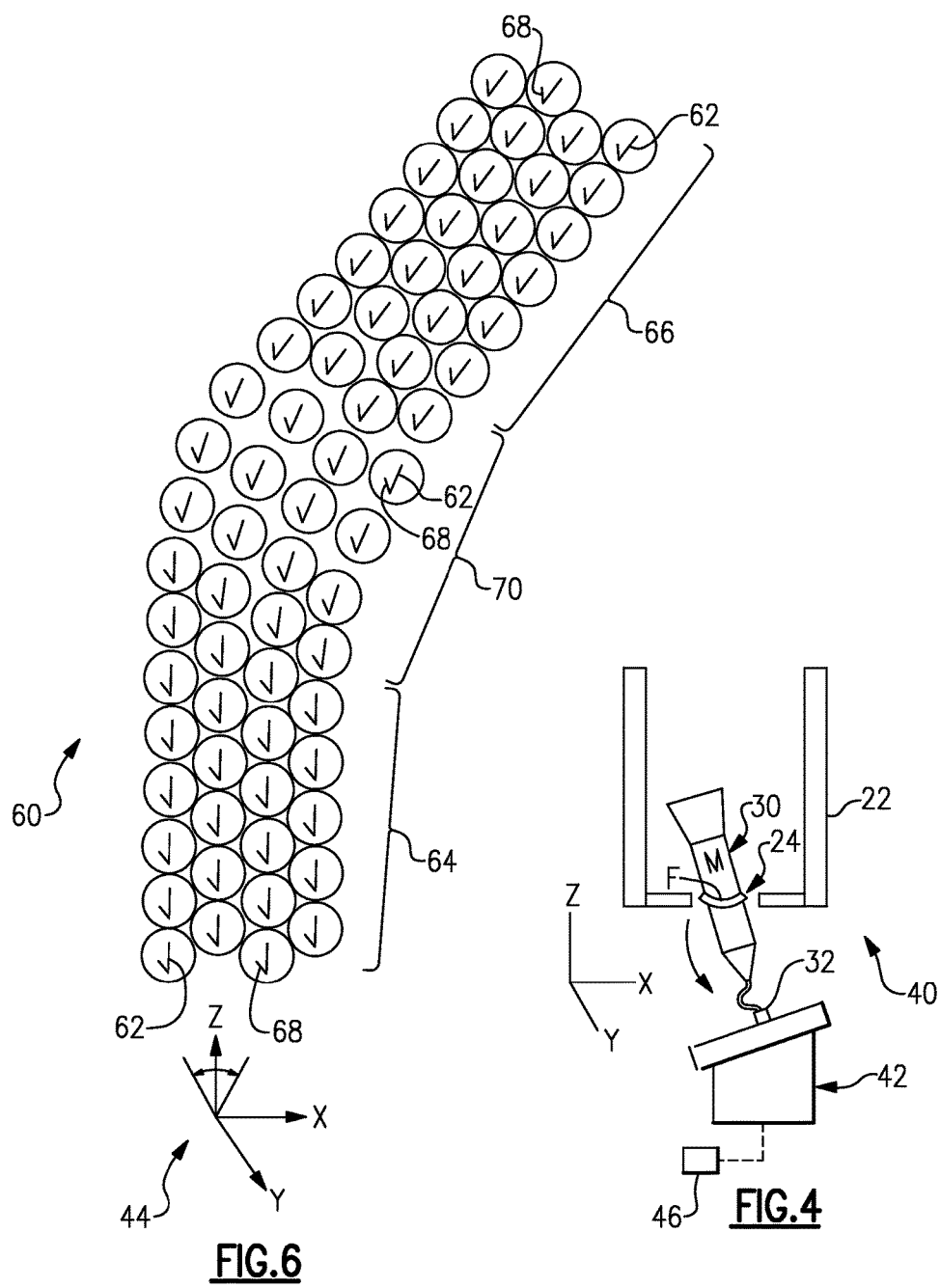
FIG. 4 illustrates multiple-axis motion including at least two different linear motions.
FIG. 6 illustrates a representative portion of a body of a cast article having a multi-textured, single crystal microstructure.

In another example represented in FIG. 4, the controller 46 and multi-axis actuator 42 are configured to retract the mold support 28 from the opening 24 with multiple-axis motion that includes at least two different linear motions, which in this case are linear motions along the Z-axis and the X-axis. It is to be understood, however, that any combination of multiple-axis motion between linear motions and rotary motions could alternatively be used. In this regard, the controller 46 and multi-axis actuator 42 can be configured to retract the mold support 28 from the opening 24 with coordinated synchronous multi-axis motion with respect to orientation of the mold support 28. The coordinated synchronous multi-axis motion refers to non-independent motion between at least two degrees of movement that is coordinated with respect to one another in accordance with a desired path of withdrawal from the furnace 22 to achieve a desired texture in the single crystal microstructure of the cast article. In some examples, the opening 24 in the baffle 26 can also be made smaller because of the enhanced manipulation provided by the use of the multi-axis motion. The use of a smaller opening 24 can further provide tighter control over the temperature profile in the furnace 22, which can reduce defects and improve yield.

Figure 5:
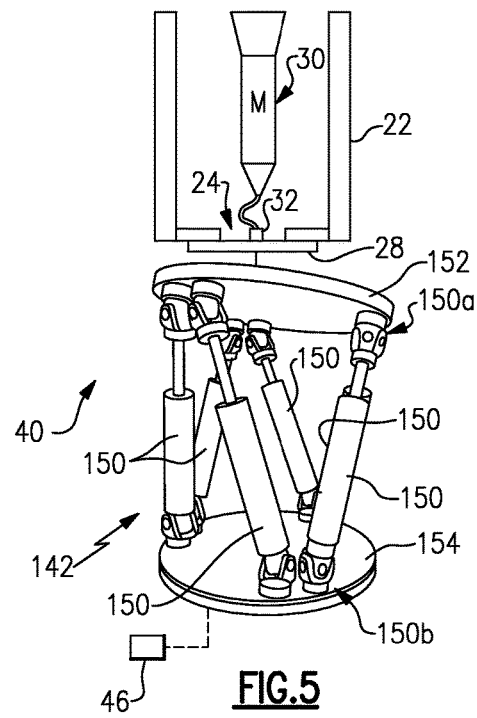
FIG. 5 illustrates an example investment casting apparatus that includes a plurality of prismatic actuators.

Referring to FIG. 5, the casting apparatus 40 in this example includes a multi-axis actuator 142 that has a plurality of prismatic actuators 150. Each prismatic actuator 150 provides linear sliding movement between an upper end 150a that is attached to a first plate 152 which is coupled to the mold support 28, and a bottom end 150b that is attached to a second plate 154. The prismatic actuators 150 can be individually actuated in coordination with each other to provide multiple-axis motion as described above. In a further example, the multi-axis actuator 142 is a Stewart platform, the arrangement of which is known and incorporated herein by reference.

The casting apparatus 40 can also embody an investment casting method that includes withdrawing, with multiple-axis motion, the mold 30 through the opening 24 of the furnace 22 to solidify a the molten metallic- or metalloid-based material in the mold 30. As described above, the withdrawing can include at least two different linear motions, at least one rotary motion, or any combination thereof.

FIG. 6 shows a schematic representation of a portion of an example cast article 60 having a multi-textured, single crystal microstructure. The article 60 can be a metallic airfoil for a gas turbine engine or a silicon wafer for a semi-conductor, for example, but is not limited to these examples. The circles represent atoms in the microstructural lattice, and the directional lines 62 and 68 represent orientations of two different crystallographic directions at that point in the lattice with respect to the coordinate system 44. In this example, the multi-textured, single crystal microstructure includes a first section at 64 and a second section at 66. The first section 64 has a first texture of the single crystal microstructure wherein the example crystallographic direction 62 is aligned within +/−10° of the Z-axis. The second section 66 has a second, different texture of the single crystal microstructure wherein the example crystallographic direction 62 is oriented differently with respect to the orientation in the first section 64 and such that the crystallographic direction 68 is aligned within +/−10° of the Z-axis. In this example, the texture of the crystallographic orientation 62 in the first section 64 corresponds to the withdrawal of the mold 30 along the Z-axis and the texture of the second crystallographic direction 68 in the second section 66 corresponds to withdrawal of the mold 30 tilted from the Z-axis.

In this example, there is also a crystallographic transition section 70 connecting the first section 64 and the second section 66. The crystallographic transition section 70 has an intermediate texture with regard to the example crystallographic directions 62 and 68 such that the crystallographic direction 62 in the crystallographic transition section is in between the orientation of the crystallographic direction 62 in the first section 64 and the orientation of the crystallographic direction 62 in the second section 66. In this example, the textures or orientations in the respective sections 64, 66, and 70 correspond to initially withdrawing the mold 30 linearly along the Z-axis, followed by withdrawing the mold 30 linearly along the Z-axis in coordinated synchronous multi-axis motion along the X-axis such that the mold 30 tilts and the solidification front reorients. As the solidification front reorients, the single crystal microstructure turns, or twists as the case may be, until the mold 30 is again withdrawn linearly along only the Z-axis, which corresponds to the texture of the second section 66. In this regard, the multi-axis motion of the withdrawal of the mold 30 can be used to preferentially provide a desired texture in a particular location of the body of the molded article and, potentially, in accordance with property requirements in that location with respect to the texture in that location. For example, the crystallographic direction 62 can be a <001> direction that is initially aligned within +/−10° of the Z-axis and the crystallographic direction 68 can be a <111> direction that is aligned within +/−10° of the Z-axis in the second section 66. Thus, whereas alignment of the <001> crystallographic direction may be desired in the first section 64 to obtain preferential properties in that section, the alignment of the <111> crystallographic direction may be more desirable in the second section 66 to obtain a different preferential set of properties in that section.

In one further example, the article 60 can be an airfoil, such as an airfoil for a turbomachine or a gas turbine engine. In this regard, the airfoil can be cast such that the single crystal microstructure has a <001> crystallographic direction aligned with the Z-axis in the root section and the <111> crystallographic direction is aligned with the Z-axis in the airfoil section. As can be appreciated, the crystallographic directions are only examples and other crystallographic directions can be preferentially aligned in different sections of an article to obtain preferential properties in association with those crystallographic directions.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An investment casting apparatus comprising:
   a furnace having an opening;
   a mold support;
   a multi-axis actuator configured to retract the mold support from the opening with multiple-axis motion, wherein the multi-axis actuator includes a plurality of prismatic actuators.

2. The apparatus as recited in claim 1, wherein the multi-axis actuator has six degrees of freedom with the multiple-axis motion.

3. The apparatus as recited in claim 1, wherein the multi-axis actuator has degrees of freedom for linear motion.

4. The apparatus as recited in claim 1, wherein the multi-axis actuator has degrees of freedom for rotary motion.

5. The apparatus as recited in claim 1, wherein the multi-axis actuator is configured to retract the mold support from the opening with coordinated synchronous multi-axis motion with respect to orientation of the mold support.

6. The apparatus as recited in claim 1, wherein the multiple-axis motion is non-oscillatory.

7. The apparatus as recited in claim 1, further comprising a grain selector and an investment mold mounted on the mold support and retractable from the furnace through the opening.

8. The apparatus as recited in claim 1, further comprising a mold mounted on the mold support for casting a molten metal- or metalloid-based material, and a controller operably connected with the multi-axis actuator, the controller being configured to selectively vary orientation of a solid-liquid interface formed in the molten metal- or metalloid-based material during retraction with respect to a geometry of the mold.

9. An investment casting method comprising:
withdrawing, with multiple-axis motion, a mold through an opening of a furnace to solidify a molten metal- or metalloid-based material in the mold, wherein the withdrawing is conducted using a multi-axis actuator that includes a plurality of prismatic actuators.

10. The method as recited in claim 9, including withdrawing with multiple-axis motion that includes at least one rotary motion.

11. The method as recited in claim 9, including withdrawing with multiple-axis motion that includes at least two different linear motions.

12. The method as recited in claim 9, including withdrawing with multiple-axis motion that includes at least one linear motion and at least one rotary motion.

13. The method as recited in claim 9, including withdrawing with multiple-axis motion that is non-oscillatory.

14. The method as recited in claim 9, including controlling orientation of a liquid-solid interface of the metal- or metalloid-based material by varying orientation of the mold during the withdrawing, to control texture of the crystal microstructure of the solidified metal- or metalloid-based material.

* * * * *